United States Patent
Padhi et al.

(10) Patent No.: US 9,646,876 B2
(45) Date of Patent: May 9, 2017

(54) ALUMINUM NITRIDE BARRIER LAYER

(71) Applicant: Applied Materials, Inc., Santa Clara, CA (US)

(72) Inventors: Deenesh Padhi, Sunnyvale, CA (US); Srinivas Guggilla, San Jose, CA (US); Alexandros T. Demos, Dublin, CA (US); Bhaskar Kumar, Santa Clara, CA (US); He Ren, San Jose, CA (US); Priyanka Dash, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 15 days.

(21) Appl. No.: 14/634,512

(22) Filed: Feb. 27, 2015

(65) Prior Publication Data
US 2016/0254181 A1 Sep. 1, 2016

(51) Int. Cl.
| | |
|---|---|
| H01L 21/44 | (2006.01) |
| H01L 21/768 | (2006.01) |
| H01L 21/02 | (2006.01) |
| H01L 23/532 | (2006.01) |

(52) U.S. Cl.
CPC .. *H01L 21/76813* (2013.01); *H01L 21/02458* (2013.01); *H01L 21/76808* (2013.01); *H01L 21/76831* (2013.01); *H01L 21/76862* (2013.01); *H01L 23/53295* (2013.01)

(58) Field of Classification Search
CPC .......... H01L 21/02104; B01J 37/0238
USPC ................. 438/625, 639, 643, 648
See application file for complete search history.

(56) References Cited

U.S. PATENT DOCUMENTS

| | | | |
|---|---|---|---|
| 3,609,471 A | 9/1971 | Scace et al. | |
| 4,030,942 A | 6/1977 | Keenan et al. | |
| 4,862,471 A | 8/1989 | Pankove | |
| 5,270,263 A | 12/1993 | Kim et al. | |
| 5,447,874 A | 9/1995 | Grivna et al. | |
| 5,677,231 A | 10/1997 | Maniar et al. | |
| 5,780,355 A * | 7/1998 | Mishra | H01L 33/007 257/E21.101 |
| 5,783,483 A | 7/1998 | Gardner | |
| 6,204,179 B1 * | 3/2001 | McTeer | H01L 21/76843 257/751 |
| 6,235,631 B1 * | 5/2001 | Russell | C23C 16/34 257/E21.168 |

(Continued)

OTHER PUBLICATIONS

International Search Report and Written Opinion of PCT/US2016/017276 mailed Apr. 29, 2016, all pages.

*Primary Examiner* — Sonya D McCall Shepard
(74) *Attorney, Agent, or Firm* — Kilpatrick Townsend & Stockton LLP

(57) ABSTRACT

A method of forming features in a dielectric layer is described. A via, trench or a dual-damascene structure may be present in the dielectric layer prior to depositing a conformal aluminum nitride layer. The conformal aluminum nitride layer is configured to serve as a barrier to prevent diffusion across the barrier. The methods of forming the aluminum nitride layer involve the alternating exposure to two precursor treatments (like ALD) to achieve high conformality. The high conformality of the aluminum nitride barrier layer enables the thickness to be reduced and the effective conductivity of the subsequent gapfill metal layer to be increased.

10 Claims, 3 Drawing Sheets

(56) References Cited

U.S. PATENT DOCUMENTS

| | | |
|---|---|---|
| 6,342,277 B1 * | 1/2002 | Sherman ............... C23C 16/452 |
| | | 117/103 |
| 6,410,426 B1 | 6/2002 | Xing et al. |
| 7,077,902 B2 | 7/2006 | Vaartstra |
| 7,084,060 B1 | 8/2006 | Furukawa et al. |
| 7,879,709 B2 * | 2/2011 | Feustel ............. H01L 21/76846 |
| | | 257/741 |
| 2002/0192898 A1 | 12/2002 | Kraus et al. |
| 2003/0008490 A1 | 1/2003 | Xing et al. |
| 2003/0186539 A1 | 10/2003 | Lee et al. |
| 2003/0222346 A1 | 12/2003 | Yun et al. |
| 2004/0036129 A1 | 2/2004 | Forbes et al. |
| 2005/0032342 A1 | 2/2005 | Forbes et al. |
| 2006/0189159 A1 | 8/2006 | Derderian et al. |
| 2011/0256718 A1 | 10/2011 | Haukka et al. |

* cited by examiner

ALUMINUM NITRIDE BARRIER LAYER

FIELD

Embodiments disclosed herein relate to forming damascene structures for microelectronic devices.

BACKGROUND

Low-k dielectrics are those having a smaller dielectric constant than silicon dioxide ($SiO_2$). Silicon dioxide has a dielectric constant of 3.9. Low-k dielectric materials are positioned between conducting elements in integrated circuits to improve achievable switching speed and reduce power consumption as feature sizes are decreased. Low-k dielectric films are achieved by selecting film materials which reduce dielectric constant and/or inserting pores inside the film.

Besides decreasing the dielectric constant, the conductivity of the conducting elements (e.g. metal lines) can be increased. As a consequence, copper has replaced many other metals for longer lines (interconnects). Copper has a lower resistivity and higher current carrying capacity. However, precautions must be taken to discourage diffusion of copper into surrounding materials. Besides the need to inhibit diffusion into active semiconductor areas, copper should be kept from entering porous low-k dielectric regions to avoid shorting and maintain the low dielectric constant.

An example of an integrated circuit structure which implements copper as an interconnect material is a dual-damascene structure. In a dual-damascene structure, the dielectric layer is etched to define both the contacts/vias and the interconnect lines. Metal is inlaid into the defined pattern and any excess metal is removed from the top of the structure in a planarization process, such as chemical mechanical polishing (CMP).

Novel liner layers and/or process modifications are needed to achieve high conductivity for the interconnect connections in combination with a low-k for the dielectric material.

SUMMARY

A method of forming features in a dielectric layer is described. A via, trench or a dual-damascene structure may be present in the dielectric layer prior to depositing a conformal aluminum nitride layer. The conformal aluminum nitride layer is configured to serve as a barrier to prevent diffusion across the barrier. The methods of forming the aluminum nitride layer involve the alternating exposure to two precursor treatments (like ALD) to achieve high conformality. The high conformality of the aluminum nitride barrier layer enables the thickness to be reduced and the effective conductivity of the subsequent gapfill metal layer to be increased.

Embodiments disclosed herein include methods of forming a gap in a low-k dielectric layer. The methods include forming a conformal barrier layer on a patterned substrate. The patterned substrate comprises a gap above an underlying copper layer. Sidewalls of the gap include low-k dielectric material. The conformal barrier layer is formed by exposing the patterned substrate to an aluminum-containing precursor and then exposing the patterned substrate to a nitrogen-and-hydrogen-containing precursor while concurrently exposing the patterned substrate to ultraviolet light. The methods further include depositing a conductor into the gap.

Embodiments disclosed herein include methods of forming a conformal aluminum nitride layer. The methods include forming a conformal aluminum nitride layer on a patterned substrate placed in a substrate processing region by: i) flowing an organoaluminum precursor into the substrate processing region; ii) removing process effluents from substrate processing region; iii) flowing a nitrogen-and-hydrogen-containing precursor into the substrate processing region while shining ultraviolet light onto the patterned substrate; and (iv) removing process effluents from the substrate processing region.

Operations i), ii), iii) and iv) may occur in the recited order. The conformal aluminum nitride layer may be configured to prevent diffusion of copper across the conformal aluminum nitride layer. Operations i), ii), iii) and iv) are repeated an integral number of times to form a conformal aluminum nitride layer. The methods may further include an operation of depositing gapfill metal into the via and the trench following the last instance of operation iv).

Embodiments disclosed herein include methods of forming a dual-damascene structure. The methods include forming a conformal silicon carbon nitride layer over a patterned substrate. The patterned substrate includes a trench and a via below the trench. The via is above an underlying copper layer. Sidewalls of the trench and the via comprise low-k dielectric walls. The trench is fluidly coupled to the via and the conformal silicon carbon nitride layer forms a hermetic seal between the trench and the low-k dielectric walls. The methods further include selectively removing a bottom portion of the conformal silicon carbon nitride layer from the underlying copper layer while retaining a side portion of the conformal silicon carbon nitride layer on the low-k dielectric walls. The methods further include placing the patterned substrate in a substrate processing region, and i) flowing an aluminum-containing precursor into the substrate processing region, ii) removing process effluents from substrate processing region, iii) flowing a nitrogen-and-hydrogen-containing precursor into the substrate processing region while shining ultraviolet light onto the dual-damascene structure of the patterned substrate, and iv) removing process effluents from the substrate processing region.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

Figure 1:
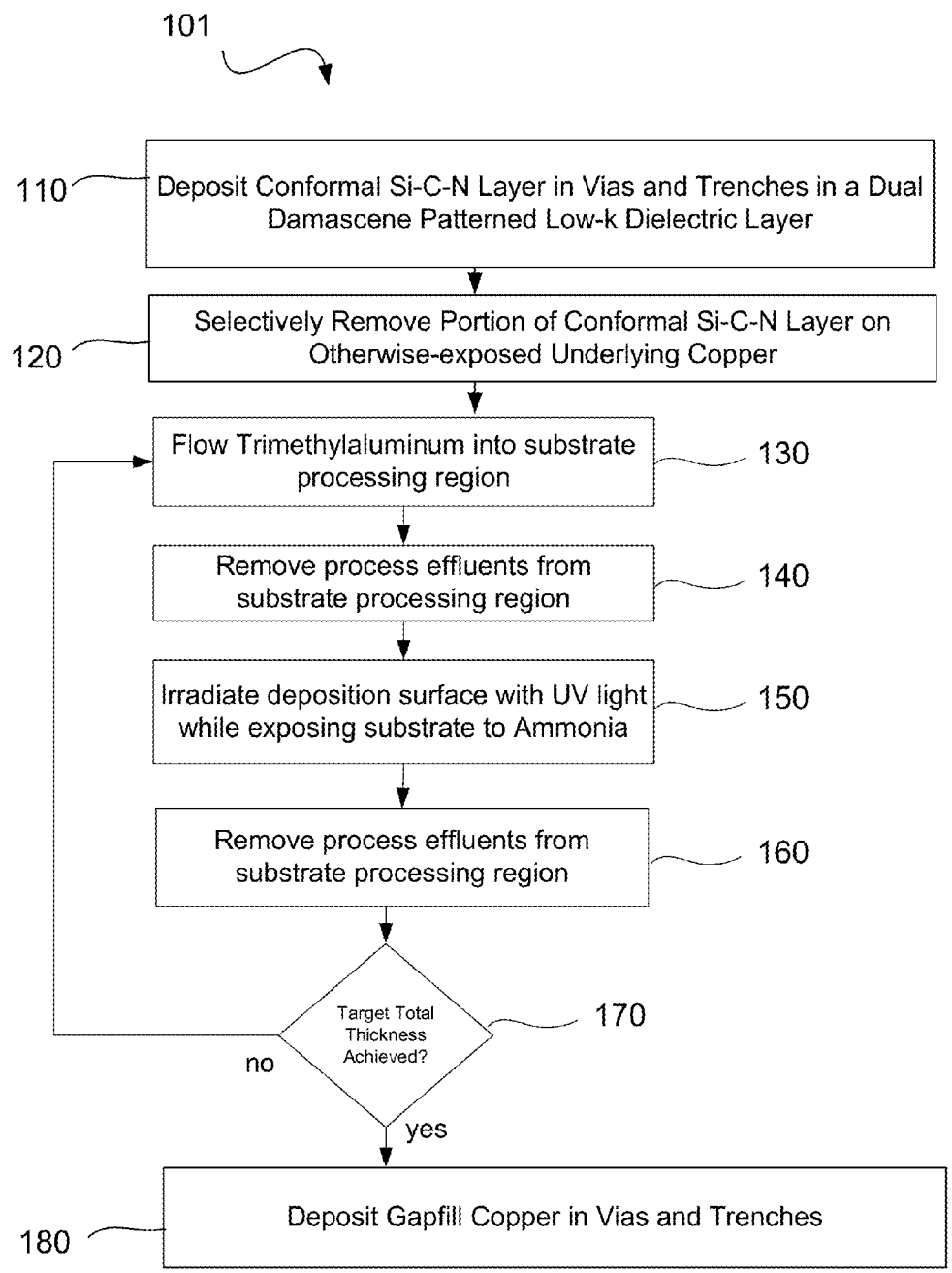
FIG. 1 is a flow chart of a conformal aluminum nitride formation process according to embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

A method of forming features in a dielectric layer is described. A via, trench or a dual-damascene structure may be present in the dielectric layer prior to depositing a conformal aluminum nitride layer. The conformal aluminum nitride layer is configured to serve as a barrier to prevent diffusion across the barrier. The methods of forming the aluminum nitride layer involve the alternating exposure to two precursor treatments (like ALD) to achieve high conformality. The high conformality of the aluminum nitride barrier layer enables the thickness to be reduced and the effective conductivity of the subsequent gapfill metal layer to be increased.

Copper damascene and dual-damascene structures have been used for several decades and involve depositing copper into gaps in a patterned low-k dielectric layer. Dual-damascene structures include two distinct patterns formed into a dielectric layer. The lower pattern may include via structures whereas the upper pattern may include a trench. The via and the trench are filled at the same time which is the operation for which the dual-damascene process gets its name. The dielectric constant of the low-k dielectric layer may be undesirably increased during subsequent processing so a conformal hermetic layer may be deposited covering both the patterned low-k dielectric layer and the exposed underlying copper layer. The portion of the conformal hermetic layer covering the underlying copper layer may be removed while retaining the conformal hermetic layer covering the patterned low-k dielectric layer. This selective removal improves electrical contact between gapfill metal and the underlying metal layer.

The methods described herein have been developed to form conformal aluminum nitride over the patterned structure to discourage diffusion and reduce the associated degradation of the low-k dielectric layer and other portions of the device under manufacture. The methods described herein provide the benefit of increasing conductivity and performance of completed devices. The conductivity is increased by reducing the thickness of the conformal aluminum nitride layer compared to past deposition methods. The reduced thickness enables more gapfill metal (e.g. gapfill copper or gapfill tungsten) to be deposited in a given dimension of via and trench. An additional benefit is the an improvement in barrier capabilities which may, for example, maintain a lower dielectric constant in the low-k dielectric layer. Maintaining a low dielectric constant in the low-k dielectric layer improves performance of completed devices (e.g. higher switching speeds or lower power consumption).

In order to better understand and appreciate the embodiments disclosed herein, reference is now made to FIG. 1 which is a conformal aluminum nitride formation process 101 according to embodiments. Concurrently, reference will be made to FIGS. 2A, 2B, 2C and 2D which show cross-sectional views of a device at various stages of conformal aluminum nitride formation process 101. The portion of the device shown may be a back-end of the line (BEOL) interconnect portion of an integrated circuit during formation in embodiments. Prior to the first operation (FIG. 2A), an exposed titanium nitride layer is formed, patterned into titanium nitride hardmask 230, and used to pattern an underlying low-k dielectric layer 220 on the patterned substrate. A copper barrier dielectric layer 210 may be used to physically separate underlying copper layer 201 from low-k dielectric layer 220. Underlying copper layer 201 is located beneath the low-k dielectric layer and is exposed to the atmosphere through the combination of the via and the trench. Generally speaking, underlying copper layer 201 may be an underlying metal layer.

Low-k dielectric layer 220 may have pores within the film to achieve a lower dielectric constant than silicon oxide. Low-k dielectric layer 220 may comprise or consist of silicon, carbon and oxygen, in embodiments, to further reduce the dielectric constant below that of silicon oxide. Low-k dielectric layer 220 may therefore be referred to as silicon oxycarbide. Conformal aluminum nitride formation process 101 has been developed to achieve and maintain a low dielectric constant within low-k dielectric layer 220 during processing and during the active life of the integrated circuit ultimately produced.

Titanium nitride hardmask 230 may be physically separated from low-k dielectric layer 220 by an auxiliary hardmask to facilitate processing, though no such layer is shown in FIG. 2A, 2B, 2C or 2D. The auxiliary hardmask layer may be a silicon oxide hardmask in embodiments. "Top", "above" and "up" will be used herein to describe portions/directions perpendicularly distal from the substrate plane and further away from the center of mass of the substrate in the perpendicular direction. "Vertical" will be used to describe items aligned in the "up" direction towards the "top". Other similar terms may be used whose meanings will now be clear.

Figure 2A:
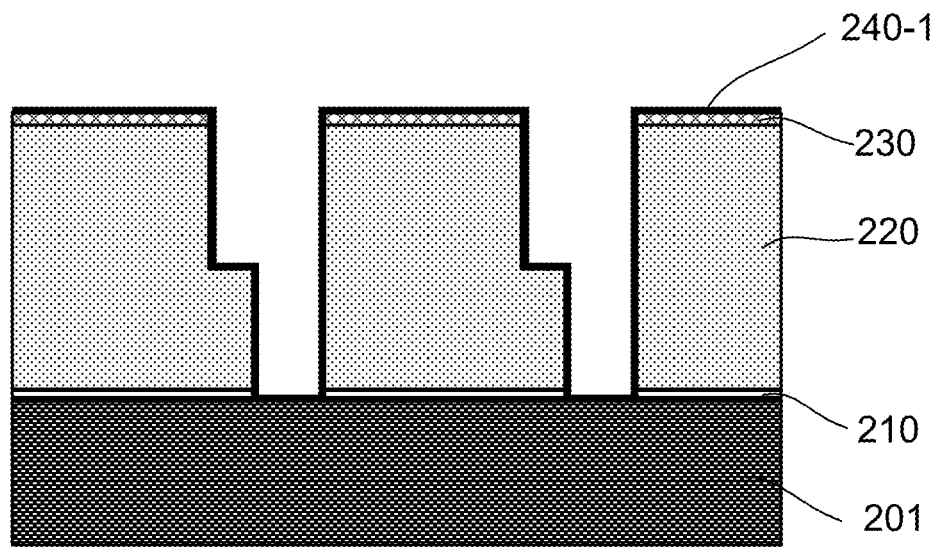
FIGS. 2A, 2B, 2C and 2D show cross-sectional views of a device at stages of a conformal aluminum nitride formation process according to embodiments.

A conformal hermetic layer 240-1 is formed on the patterned substrate in operation 110, shown following formation in FIG. 2A. The conformal hermetic layer is conformal over the features of the patterned substrate and contacts underlying copper layer 201 directly in embodiments. The conformal hermetic layer may also contact low-k dielectric layer 220 directly according to embodiments. Conformal hermetic layer 240-1 may be a silicon-and-carbon-containing layer or a silicon carbon nitride layer in embodiments. Conformal hermetic layer 240-1 may comprise or consist of silicon, carbon and nitrogen, according to embodiments, and may be referred to as silicon carbon nitride or Si—C—N. Conformal hermetic layer 240-1 may inhibit diffusion of subsequently-introduced etchants or moisture and may therefore protect the integrity of low-k dielectric layer 220 during and after processing in embodiments. The deposition process of conformal hermetic layer 240-1 may result in a lowering of the dielectric constant simply from the displacement of absorbates and other components within low-k dielectric layer 220. Conformal hermetic layer 240-1 (and conformal hermetic layer 240-2 later) may help to avoid diffusion of copper into low-k dielectric layer 220 as well, according to embodiments.

Figure 2B:
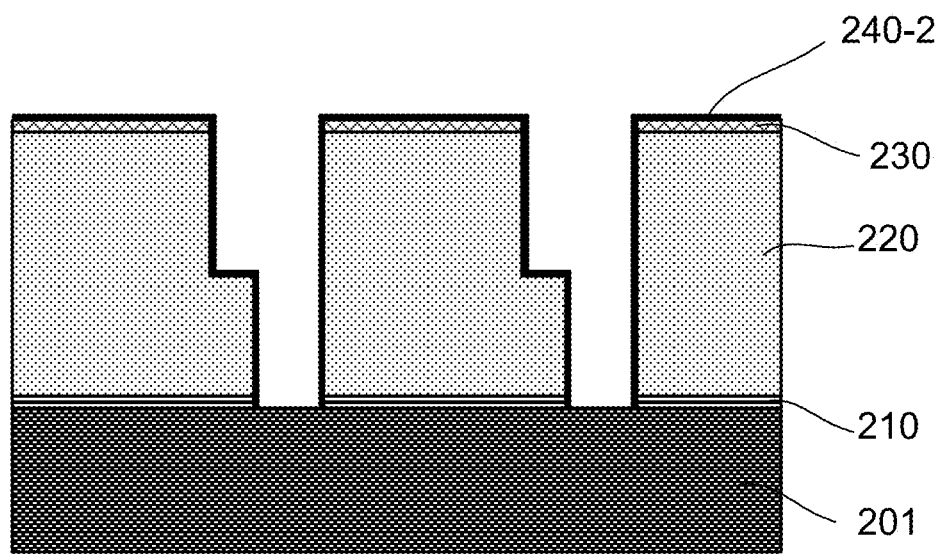

Conformal hermetic layer (e.g. Si—C—N) is exposed to acetic acid in operation to etch back and expose underlying copper layer 201 in operation 120, shown following the operation in FIG. 2B. More generally, a mild acid may be used instead of or to augment the acetic acid according to embodiments. The mild acid may be referred to as a weak acid and may have a pH between 5 and 7 in embodiments. Selective etching operation 120 may involve liquid or gas-phase etchants according to embodiments. A process which uses gas-phase etchants may be referred to herein as a dry-etch and etching operations within a dry-etch may be referred to as dry-etching conformal hermetic layer 240-1. After selective etching operation 120 a portion of conformal hermetic layer 240-1 remains and will be referred to as conformal hermetic layer 240-2 as shown in FIG. 2B.

Conformal hermetic layer 240-2 may also be referred to as the remaining portion of conformal hermetic layer 240-1. Conformal hermetic layer 240-2 continues to seal low-k dielectric layer 220 from environmental influences such as subsequently introduced reactants or moisture which may get into pores in low-k dielectric layer 220 and undesirably increase the dielectric constant.

A conformal aluminum nitride layer 250 is now formed on conformal hermetic layer 240-2 and underlying copper layer 201 using an alternating exposure technique to form an extremely conformal film. Conformal aluminum nitride layer 250 may consist of aluminum and nitrogen according to embodiments. The patterned substrate is transferred into a substrate processing region in the event that the patterned substrate is not already present in the substrate processing region. An aluminum-containing precursor is flowed into the substrate processing region in operation 130. The aluminum-containing precursor may be an organometallic precursor or an organoaluminum precursor according to embodiments. The aluminum-containing precursor may comprise or consist of one or more of triethylaluminum or trimethylaluminum. The aluminum-containing precursor may comprise or consist of aluminum, carbon and hydrogen in embodiments. Following exposure, process effluents (such as unused precursor and reaction by-products) are removed from the substrate processing region in operation 140.

In operation 150, the substrate is exposed to a nitrogen-and-hydrogen-containing precursor and irradiated with ultraviolet light at the same time. The nitrogen-and-hydrogen-containing precursor may be flowed into the substrate processing region, in operation 150, to expose the substrate to the precursor in embodiments. The nitrogen-and-hydrogen-containing precursor may comprise or consist of $NH_3$, $N_2H_2$, $N_2H_4$ according to embodiments. The nitrogen-and-hydrogen-containing precursor may be NxHy where x and y are integers in embodiments. The nitrogen-and-hydrogen-containing precursor may comprise or consist of nitrogen and hydrogen in embodiments. Operation 150 completes one growth cycle of conformal aluminum nitride layer 250 according to embodiments in embodiments. Process effluents may be removed in operation 160 either in preparation for depositing a conductor or repeating operations 130-150 and forming a thicker conformal aluminum nitride layer 250.

Figure 2C:
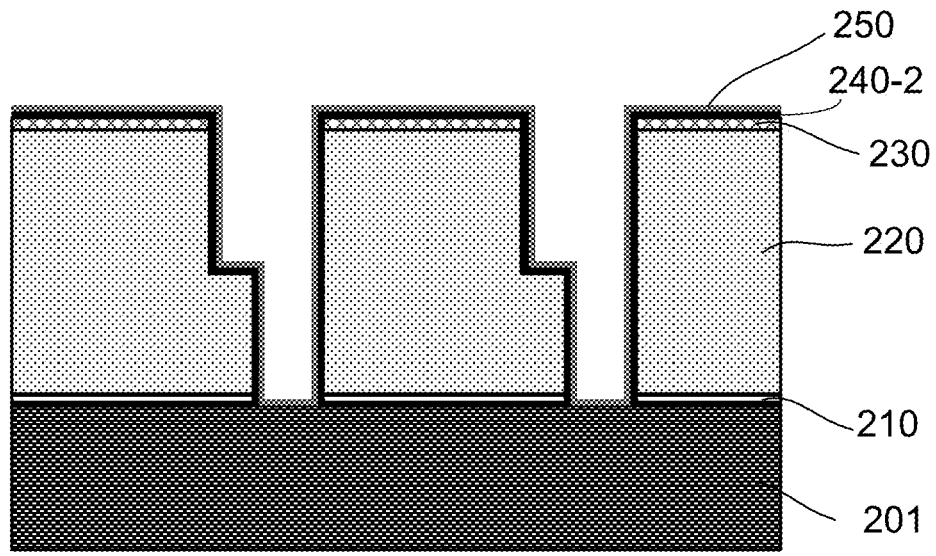
Figure 2D:
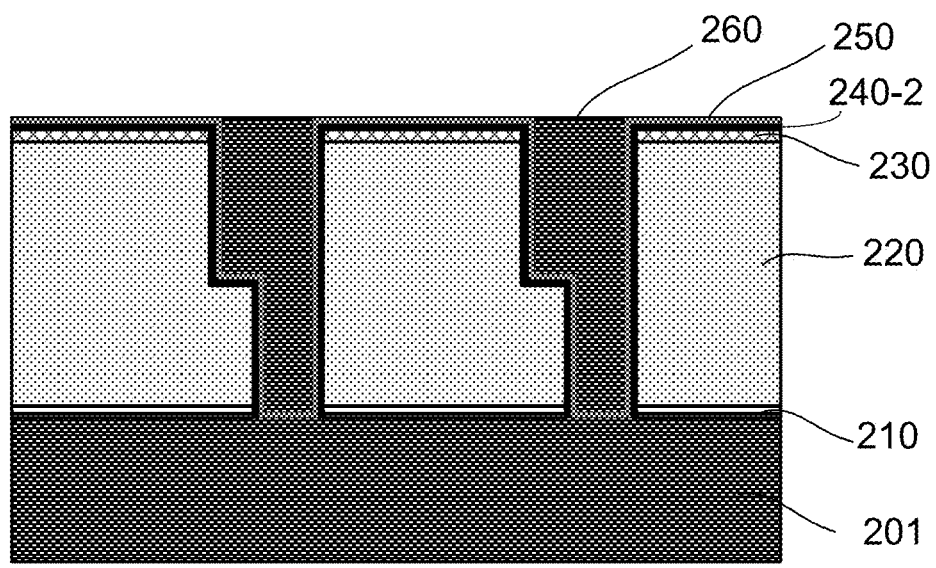

In operation 170, the thickness of conformal aluminum nitride layer 250 is determined to either be sufficient or to require another iteration of operations 130-150 to form another layer of aluminum nitride. Operation 170 may be a direct measurement of conformal aluminum nitride layer 250 or operation 170 may be a comparison of the number of cycles completed with a stored target number of cycles. Should the target thickness or target number of cycles have been achieved, conformal aluminum nitride layer 250 is finished as shown in FIG. 2C. Conformal aluminum nitride formation process 101 then includes formation of gapfill metal (e.g. gapfill copper 260) into the via and trench of the dual-damascene structure of the patterned substrate in operation 140. The device following operation 140 is shown in FIG. 2D. FIG. 2D shows underlying copper 201 electrically connected to gapfill copper 260 through conformal aluminum nitride layer 250. As a result of operation 120, there is no or substantially no portion of conformal hermetic layer 240 to negatively impact the conductivity from underlying copper 201 to gapfill copper 260. Technically, FIG. 2D shows gapfill copper 260 after a planarizing chemical mechanical polishing (CMP) operation since the top surface is flush with the low-k dielectric film stack. Conformal nitride formation process 101 further includes an operation of chemical mechanical polishing the gapfill metal layer according to embodiments.

The thickness of conformal aluminum nitride layer 250 should be sufficient to form a barrier to diffusion between regions above and below the conformal aluminum nitride layer. In embodiments, the thickness of conformal aluminum nitride layer 250 is sufficient to stop diffusion of, for example, metal atoms into dielectrics or semiconductors in the vicinity. The thickness should be less than a threshold amount to enable enough conducting material (e.g. copper) to desirably fill the gaps in the patterned low-k dielectric layer and form conducting contacts. Conformal aluminum nitride layer 250 may reside on underlying copper layer 201 and on conformal hermetic layer 240 following deposition. If no conformal hermetic layer 240 is used, then conformal aluminum nitride layer 250 may reside on underlying copper layer 201 and directly on low-k dielectric layer 220 in embodiments. The thickness of the conformal aluminum nitride layer 250 may be less than 6 nm, less than 4 nm, between 1 nm and 6 nm, between 1.5 nm and 5 nm, or between 2 nm and 4 nm according to embodiments. Conformal aluminum oxide layer 250 may be formed on wall of a gap in the patterned low-k dielectric layer according to embodiments.

The thickness of conformal hermetic layer 240 should be sufficient to form a hermetic seal configured to keep moisture out of the low-k dielectric layer. The thickness should be less than a threshold amount to enable enough conducting material (e.g. copper) to desirably fill the gaps in the patterned low-k dielectric layer and form conducting contacts. The thickness should also be less than a threshold amount to ensure the portion of the conformal hermetic layer on the underlying copper layer is selectively removable. A first portion of the conformal hermetic layer resides on the underlying copper layer following deposition. A second portion of the conformal hermetic layer resides on the low-k dielectric layer 220, for example on wall of a gap in the patterned low-k dielectric layer following deposition. The thickness of the second portion of the conformal hermetic layer may be greater than 1.5 nm or greater than 2 nm, according to embodiments, after deposition but before selective removal. The thickness of the second portion of the conformal hermetic layer may be less than 30 nm or less than 40 nm, in embodiments, after deposition but before selective removal.

The dielectric constant of low-k dielectric layer 220 may be between 2.4 and 2.9 prior to depositing the (optional) conformal hermetic layer and the conformal aluminum nitride layer. The conformal hermetic layer may be deposited by UV-assisted chemical vapor deposition (UV-CVD) and the deposition process may result in a reduction of the dielectric constant, possibly by replacing hydroxyl groups on the interior surfaces of pores with methyl groups. The dielectric constant may be reduced by 0.1 simply by depositing conformal hermetic layer 240-1. The dielectric constant may be between 2.3 and 2.8 after deposition but before selective removal.

The selective removal operation may remove the first portion but not the second portion of the conformal hermetic layer. The selective removal operation may expose the underlying copper layer in embodiments. This ensures subsequent capability of achieving a highly conductive connection between the conductor which fills the gaps in the patterned low-k dielectric layer and the underlying copper layer (or, more generally, another underlying metal layer). The contact between the gapfill conductor and the underlying copper layer may be an ohmic contact according to embodiments. The thickness of the second portion of the conformal hermetic layer may be greater than 1.5 nm, or greater than 2 nm, according to embodiments, after the selective removal operation. The thickness of the second portion of the conformal hermetic layer may be less than 3 nm or less than 4 nm, in embodiments, after the selective removal operation. After the selective removal operation, the dielectric constant of low-k dielectric layer 220 may be between 2.3 and 2.8. In some embodiments, no conformal hermetic layer is present, in which case all the thicknesses are zero and operations 110 and 120 are not present in the method. The dielectric constant of low-k dielectric layer 220 may be between 2.3 and 2.8 following formation of conformal aluminum nitride layer 250, after depositing gapfill copper/metal 260 or as measured in a completed device in embodiments.

The trench and/or via structures lined with the conformal hermetic layer may be a dual-damascene structure including a via underlying a trench. The via may be a low aspect ratio gap and may be, e.g., circular as viewed from above the patterned substrate laying flat. The structure may be at the back end of the line which may result in larger dimensions depending on the device type. A width of the via may be less than 50 nm, less than 40 nm, less than 30 nm or less than 20 nm according to embodiments. A width of the trench may be less than 70 nm, less than 50 nm, less than 40 nm or less than 30 nm in embodiments. The dimensions described herein apply to structures involving a single-patterned low-k dielectric layer or a multi-patterned low-k dielectric layer (e.g. dual-damascene structure). An aspect ratio of the via may be about 1:1, as viewed from above, whereas an aspect ratio of the trench may be greater than 10:1 since the trench is used to contain a conductor meant to electrically attach multiple vias.

The examples described herein involve the preparation of a long trench above a low-aspect ratio via in a dual-damascene structure. Generally speaking the structure may involve only one level and the low-k dielectric layer may have long trenches and/or vias according to embodiments. For the purposes of description herein and claim recitations below, a via is simply a low-aspect ratio gap and so the term "gap" covers all holes in a low-k dielectric described herein. Generally speaking, underlying copper layer 201 may be any underlying conducting layer in embodiments.

During operations 130 and/or 150, the substrate may be maintained between 30° C. and about 500° C. in general. The temperature of the patterned substrate during operations 130 and/or 150 may be between 100° C. and 450° C., between 150° C. and 400° C. or between 200° C. and 370° C. in embodiments. During etching operation 120, the substrate may be maintained between −30° C. and about 200° C. in general. The temperature of the patterned substrate during operation 120 may be between −20° C. and 150° C., 10° C. and 200° C., between 20° C. and 75° C. or between 25° C. and 50° C. in embodiments.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon oxide" of the patterned substrate is predominantly $SiO_2$ but may include concentrations of other elemental constituents such as, e.g., nitrogen, hydrogen and carbon. In some embodiments, silicon oxide portions etched using the methods disclosed herein consist essentially of silicon and oxygen. Exposed "silicon nitride" of the patterned substrate is predominantly $Si_3N_4$ but may include concentrations of other elemental constituents such as, e.g., oxygen, hydrogen and carbon. In some embodiments, silicon nitride portions described herein consist essentially of silicon and nitrogen. Exposed "titanium nitride" of the patterned substrate is predominantly titanium and nitrogen but may include concentrations of other elemental constituents such as, e.g., oxygen, hydrogen and carbon. In some embodiments, titanium nitride portions described herein consist essentially of titanium and nitrogen. Exposed "aluminum nitride" of the patterned substrate is predominantly aluminum and nitrogen but may include concentrations of other elemental constituents such as, e.g., oxygen, hydrogen and carbon. In some embodiments, aluminum nitride portions described herein consist essentially of aluminum and nitrogen. The low-k dielectric may be "silicon oxycarbide" which is predominantly silicon, oxygen and carbon but may include concentrations of other elemental constituents such as, e.g., nitrogen and hydrogen. In some embodiments, silicon oxycarbide portions described herein consist essentially of silicon, oxygen and carbon. Exposed "silicon carbon nitride" of the patterned substrate is predominantly silicon, carbon and nitrogen but may include concentrations of other elemental constituents such as, e.g., oxygen and hydrogen. In some embodiments, silicon carbon nitride portions described herein consist essentially of silicon, carbon and nitrogen. "Copper" of the patterned substrate is predominantly copper but may include concentrations of other elemental constituents such as, e.g., oxygen, nitrogen, hydrogen and carbon. In some embodiments, copper portions described herein consist essentially of copper. Analogous definitions for other metals will be understood from this copper definition.

The term "gap" is used throughout with no implication that the etched geometry has a large horizontal aspect ratio. Viewed from above the surface, gaps may appear circular, oval, polygonal, rectangular, or a variety of other shapes. The term "trench" is defined as a large aspect ratio gap with a long dimension (viewed from above) at least ten times a short dimension (also viewed from above). The long dimension does not have to be linear, e.g., a trench may be in the shape of a moat around an island of material, in which case the long dimension is the circumference. The term "via" is used to refer to a low aspect ratio gap which may or may not be filled with metal to form a vertical electrical connection. As used herein, a conformal layer or conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the embodiments. Accordingly, the above description should not be taken as limiting the scope of the claimed subject matter.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the disclosure, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of forming a gap in a low-k dielectric layer, the method comprising:
    forming a conformal barrier layer on a patterned substrate, wherein the patterned substrate comprises a gap above an underlying copper layer, wherein sidewalls of the gap comprise low-k dielectric material, wherein the conformal barrier layer is formed by:
        exposing the patterned substrate to an aluminum-containing precursor and then,
        exposing the patterned substrate to a nitrogen-and-hydrogen-containing precursor while concurrently exposing the patterned substrate to ultraviolet light;
    wherein the conformal barrier layer consists of aluminum and nitrogen and a thickness of the conformal barrier layer is less than 6 nm and the method further comprises depositing a conductor into the gap.

2. The method of claim 1 wherein the aluminum-containing precursor is an organometallic precursor.

3. The method of claim 1 wherein the aluminum-containing precursor comprises comprise one or more of triethylaluminum or trimethylaluminum.

4. The method of claim 1 wherein a width of the gap is less than 20 nm.

5. The method of claim 1 wherein a dielectric constant of the low-k dielectric material is between 2.3 and 2.8 following formation of the conformal barrier layer.

6. A method of forming a conformal aluminum nitride layer, the method comprising:
    placing a patterned substrate in a substrate processing region, wherein the patterned substrate comprises a gap and the sidewalls of the gap comprise low-k dielectric material;
    forming a conformal aluminum nitride layer on the patterned substrate placed in the substrate processing region by:
        i) flowing an organoaluminum precursor into the substrate processing region,
        ii) removing process effluents from substrate processing region,
        iii) flowing a nitrogen-and-hydrogen-containing precursor into the substrate processing region while shining ultraviolet light onto the patterned substrate, and
        (iv) removing process effluents from the substrate processing region;
    wherein the conformal aluminum nitride layer consists of aluminum and nitrogen and a thickness of the conformal aluminum nitride layer is less than 6 nm.

7. The method of claim 6 wherein operations i) through iv) occur in the recited order.

8. The method of claim 6 wherein the conformal aluminum nitride layer is configured to prevent diffusion of copper across the conformal aluminum nitride layer.

9. The method of claim 6 wherein operations i) through iv) are repeated an integral number of times to form a conformal aluminum nitride layer.

10. The method of claim 6 further comprising an operation of depositing gapfill metal into the gap following operation iv).

* * * * *